United States Patent
Tseng et al.

(10) Patent No.: US 6,435,865 B1
(45) Date of Patent: Aug. 20, 2002

(54) APPARATUS AND METHOD FOR POSITIONING GAS INJECTORS IN A VERTICAL FURNACE

(75) Inventors: Heng-Yi Tseng, Hsin-Chu; Guey-Shyung Cho, Shinpu Jen, both of (TW)

(73) Assignee: Taiwan Semiconductor Manufacturing Co., Ltd., Hsin Chu (TW)

(*) Notice: Subject to any disclaimer, the term of this patent is extended or adjusted under 35 U.S.C. 154(b) by 0 days.

(21) Appl. No.: 09/918,009

(22) Filed: Jul. 30, 2001

(51) Int. Cl.[7] ................................................. F27B 9/04
(52) U.S. Cl. ........................ 432/152; 432/241; 118/715
(58) Field of Search ........................ 432/95, 152, 241; 219/390, 405, 411; 392/416, 418; 118/715, 724, 725

(56) References Cited

U.S. PATENT DOCUMENTS 5,383,984 A * 1/1995 Shimada et al. ...... 118/723 ER

* cited by examiner

Primary Examiner—Jiping Lu
(74) Attorney, Agent, or Firm—Tung & Associates

(57) ABSTRACT

A vertical furnace equipped with self-positioning gas injectors for processing wafers and a method for mounting self-positioning gas injectors in the furnace are disclosed. The vertical furnace is constructed by a cylindrical-shaped tube fabricated of quartz having a cavity therein for positioning of a wafer boat; a mounting ring positioning inside the cavity and for mounting the gas injectors thereon; and a plurality of gas injectors each formed in a "L" configuration with a stopper formed on a bottom of the horizontal portions of the gas injectors such that each of the stoppers is formed at a different location and fits only one slot opening formed on the mounting ring.

20 Claims, 2 Drawing Sheets

APPARATUS AND METHOD FOR POSITIONING GAS INJECTORS IN A VERTICAL FURNACE

FIELD OF THE INVENTION

The present invention generally relates to an apparatus and a method for positioning gas injectors in a vertical furnace and more particularly, relates to an apparatus and a method for positioning a plurality of gas injectors in a mounting ring in a vertical furnace wherein the gas injectors may be self-positioned without mis-installation.

BACKGROUND OF THE INVENTION

In connection with processes used to manufacture semiconductor devices, such as integrated circuits, numerous process steps are carried out in a controlled environment at elevated temperatures. Such processes includes oxidation, diffusion, chemical vapor deposition and annealing. In order to realize elevated processing temperatures, semiconductor wafers are processed in an evacuated chamber, typically in a form of a quartz tube which is housed within a semiconductor furnace.

The most common type of semiconductor furnace is of the so-called "hot wall" electric type which facilitates batch processing of semiconductor wafers. Furthermore, hot wall electric furnaces exhibit excellent temperature stability and precise temperature control. Modern hot wall diffusion furnaces are capable of controlling temperatures over the range of 300°–1200° C. to an accuracy of 0.5° or –0.5° C. Hot wall furnaces were initially designed as horizontal diffusion furnaces, however, more recently, vertical furnaces have gained favor because they present a number of advantages over their horizontal predecessors. These advantages include: elimination of cantilever or soft-landing since the wafers are held in a quartz boat which does not touch the process tube walls; wafers can be loaded and unloaded automatically; and, the clean room footprint of the system is somewhat smaller than that of the conventional horizontal configuration.

Vertical semiconductor furnaces of the type mentioned above employ a quartz tube which typically has a polysilicon coating when used for a deposition or annealing process. The polysilicon deposition reduces the power loss due to quartz reflection or radiation, and reduces the degradation of a boat occasioned by wet etching. Because semiconductor furnaces are subjected to high rates of usage and their components are exposed to harsh operating environments, periodic maintenance must be performed on various furnace components, including the quartz tube assembly.

In a vertical furnace, a plurality of gas injectors for flowing into the furnace a variety of process gases is also provided. The gas injectors are normally formed of quartz tubes and are positioned in a mounting ring at a bottom of the furnace. The gas injectors are normally formed in a "L" shape such that the horizontal portion of the "L" sits in a slot opening provided in the mounting ring while the vertical portion of the "L" stands perpendicularly to the mounting ring with a number of nozzle openings provided in the quartz tube for flowing a process gas therethrough. Several different process gases may be required for a single process. For instance, in a chemical vapor deposition process for forming silicon oxide, at least three gas injectors for feeding the three different gases are provided in the vertical furnace. During $SiO_2$ deposition, a first gas injector may be used for feeding silane gas into the chamber cavity, a second gas injector may be used for feeding $N_2O$ gas into the chamber cavity, while a third gas injector may be used to feed a carrier or a dilution gas of $N_2$ into the chamber cavity.

In a typical chemical vapor deposition process conducted in a vertical furnace, as many as 172 wafers may be stacked in a wafer boat and positioned in the chamber cavity. In order to accommodate a large wafer boat that carries as many as 172 wafers, a substantially tall furnace tube must be utilized. For instance, a vertical furnace tube as long as 150 cm may be necessary to allow the processing of a large number of wafers. During the furnace process, the positioning of the various gas injectors in the furnace cavity is therefore important not only from a quality point-of-view, but also from a process repeatability point-of-view. In order to carry out a consistent deposition process, the position of each gas injector for the particular process gas must be exactly the same during each batch of wafer processing. For instance, in $SiO_2$ deposition, the length of the plurality of gas injectors may range between about 60 cm and about 150 cm. A repeatable process can only be achieved by locating the plurality of gas injectors at exactly the same location each time the process is repeated on a different batch of wafers. The positioning, or the ability to self-positioning the plurality of gas injectors in a vertical furnace is therefore very important.

It is therefore an object of the present invention to provide a vertical furnace that is equipped with a plurality of gas injectors for processing wafers in the furnace cavity that does not have the drawbacks or shortcomings of the conventional vertical furnace.

It is another object of the present invention to provide a vertical furnace that is equipped with self-positioning gas injectors for processing wafers that is capable of producing repeatable results.

It is a further object of the present invention to provide a vertical furnace that is equipped with self-positioning gas injectors for processing wafers wherein a plurality of quartz gas injectors in "L" configuration is utilized.

It is another further object of the present invention to provide a vertical furnace that is equipped with self-positioning gas injectors for processing wafers wherein a plurality of quartz gas injectors in "L" configuration each equipped with a stopper mounted on a horizontal portion of the injector is utilized.

It is still another object of the present invention to provide a vertical furnace that is equipped with self-positioning gas injectors for processing wafers wherein a mounting ring which has a plurality of slot openings each with a different dimension for mounting the plurality of gas injectors is provided.

It is yet another object of the present invention to provide a vertical furnace that is equipped with self-positioning gas injectors for processing wafers wherein a plurality of slot openings of varying dimensions is provided in a mounting ring for the self-positioning of a plurality of gas injectors each equipped with a stopper mounted on the injector at a different location.

It is still another further object of the present invention to provide a method for mounting a plurality of gas injectors in a vertical furnace for processing wafers by first mounting a stopper to the plurality of gas injectors at a different position for each process gas such that the gas injectors are installed in the mounting ring at the same location repeatedly.

SUMMARY OF THE INVENTION

In accordance with the present invention, an apparatus and a method for positioning gas injectors in a vertical furnace with repeatable results such that the same gas injector is always installed at the same location are provided.

In a preferred embodiment, a vertical furnace that is equipped with self-positioning gas injectors for processing wafers is provided which includes a cylindrical-shaped tube that has a sealed top and an open bottom, the open bottom is sealable by an end cap; a cavity formed inside the cylindrical-shaped tube that has a size sufficient for a wafer carrier to be positioned therein; a mounting ring for positioning inside the cavity juxtaposed to the open bottom, the mounting ring has a substantially rectangular cross-section, a width in the radial direction, a thickness in the vertical direction, and a plurality of slot openings each opens to an outer periphery of the ring and each has a different depth cut into the width of the ring; and a plurality of gas injectors each formed in an "L" shape with a vertical portion and a horizontal portion in fluid communication with each, each of the horizontal portions has an inlet end and is provided with a stopper mounted on a bottom surface at a different location for each injector when measured from the inlet end of the horizontal portion such that when the plurality of gas injectors are positioned on top of the mounting ring with each of the nozzle stoppers engaging a corresponding one of the plurality of slot openings, the horizontal portions of the plurality of gas injectors extend into the cavity of the cylindrical-shaped tube in the radial direction at a substantially equal distance as measured from an inner surface of the cylindrical-shaped tube.

The vertical furnace that is equipped with self-positioning gas injectors for processing wafers may further include an inner tube positioned inside the cylindrical-shaped tube for defining the cavity. The cylindrical-shaped tube may further include a plurality of apertures adapted for the inlet ends of the plurality of gas injectors to penetrate therethrough. The inlet ends of the plurality of gas injectors may each be provided with an O-ring for sealingly engaging a gas supply conduit. The cavity may be sufficiently large for a wafer boat that carries at least 172 wafers to be positioned therein. The cylindrical-shaped tube may be fabricated of a substantially transparent, high temperature resistant ceramic material; the cylindrical-shaped tube and the plurality of gas injectors may be fabricated of quartz. The mounting ring may be fabricated of a high temperature and corrosion-resistant material, such as stainless steel. The vertical portions of the plurality of gas injectors may further include at least one aperture as a gas outlet. The vertical portions of the plurality of gas injectors may each have a length between about 50 cm and about 150 cm. The stoppers may be mounted as on the plurality of gas injectors each being formed to a length of at least 5 mm, a height of at least 5 mm and a thickness of at least 5 mm. The stoppers may be formed of quartz and are fused to the horizontal portions of the plurality of gas injectors. The horizontal portions of the plurality of gas injectors may have the same length of at least 40 mm.

The present invention is further directed to a method for mounting a plurality of gas injectors in a vertical furnace for processing wafers which may be carried out by the operating steps of first providing a furnace body of a cylindrical-shaped tube that has a sealed top and an open bottom, the open bottom may be sealable by an end cap, the furnace body may have a cavity formed therein having a size sufficient for a wafer carrier to be positioned therein, the furnace body may further have a mounting ring positioned inside the cavity juxtaposed to the open bottom, the mounting ring may have a substantially rectangular cross-section, section, a width in the radial direction, a thickness in the vertical direction and a plurality of slot openings each opens to an outer periphery of the ring and each has a different depth cut into the width of the ring; then providing a plurality of gas injectors in tubular shape each formed in a "L" configuration that has a vertical portion and a horizontal portion in fluid communication with each other, each of the horizontal portions may have an inlet and are provided with a stopper mounted on a bottom surface at a location different than the other gas injectors when measured from the inlet end of the horizontal portion; and positioning the plurality of gas injectors on top of the mounting ring by engaging each of the stoppers on the gas injectors to a corresponding one of the plurality of slot openings on the mounting ring such that the horizontal portions of the plurality of gas injectors extend into the cavity of the cylindrical-shaped tube in a radial direction at a substantially equal distance as measured from an inner surface of the cylindrical-shaped tube.

The method for mounting a plurality of gas injectors in a vertical furnace for processing wafers may further include the step of penetrating the inlet ends of the plurality of gas injectors through a plurality of apertures in the furnace body for connecting to a plurality of gas supplies. The method may further include the step of mounting onto each of the inlet ends of the plurality of gas injectors an O-ring for sealingly engaging a gas supply conduit. The method may further include the step of preventing the vertical portions of the plurality of gas injectors from tilting away from a vertical position by engaging the stoppers on the gas injectors to the slot openings in the mounting ring. The method may further include the step of fabricating the cylindrical-shaped tube and the plurality of gas injectors in quartz, or the step of fabricating the mounting ring in a high temperature and corrosion-resistant material such as stainless steel. The method may further include the step of fabricating the vertical portions of the plurality of gas injectors with at least one aperture for gas outlet.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an apparatus and a method for positioning gas injectors in a vertical furnace. According to a preferred embodiment of the present invention, a vertical furnace that is equipped with self-positioning gas injectors for processing wafer such as in a chemical vapor deposition process is provided. The furnace includes the major components of a cylindrical-shaped tube, a cavity formed in the tube, a mounting ring for positioning of the plurality of gas injectors, and the plurality of gas injectors each equipped with a stopper. The mounting ring further includes a plurality of slot openings formed in the ring such that a corresponding one of the gas injectors with stoppers can fit in the same slot opening each time the gas injector is dismounted and cleaned during a maintenance procedure.

By utilizing the present invention novel apparatus of a mounting ring equipped with different positioned slot openings, and a plurality of gas injectors each equipped with a differently positioned stopper on the horizontal part of the injector, the plurality of gas injectors may be self-positioned into the mounting ring in the same way each time the vertical furnace is disassembled and assembled together.

By utilizing the present invention novel apparatus, only the correct gas injector may be positioned into the slot opening for the specific gas injector such that the same process gas is always dispersed into the furnace chamber in the same way as in the previous processes conducted in the chamber. The multiplicity of gas injectors is normally formed of different lengths such that different types of processing gases may be dispersed into the reaction chamber in a specifically designed, desirable manner. The present invention novel apparatus allows such specifically designed, desired manner of gas dispersion into the reaction chamber to be repeated exactly the same way in each batch of wafer processing. A repeatable process can thus be conducted leading to reliable IC devices being fabricated.

The present invention further discloses a method for mounting a plurality of gas injectors in a vertical furnace for processing wafers wherein the same gas injector is always mounted at the same position inside the furnace such that reproducible chemical processes can be conducted in the furnace. The repeatability of mounting of the gas injector at the same location is achieved by providing a mounting ring that has slot openings of different sizes cut into the opening, and a plurality of gas injectors each equipped with a stopper mounted on a bottom surface of a horizontal portion at a different location such that only one gas injector may fit into a specific slot opening in the mounting ring. The self-positioning of gas injectors into the furnace cavity is thus achieved.

Figure 1:
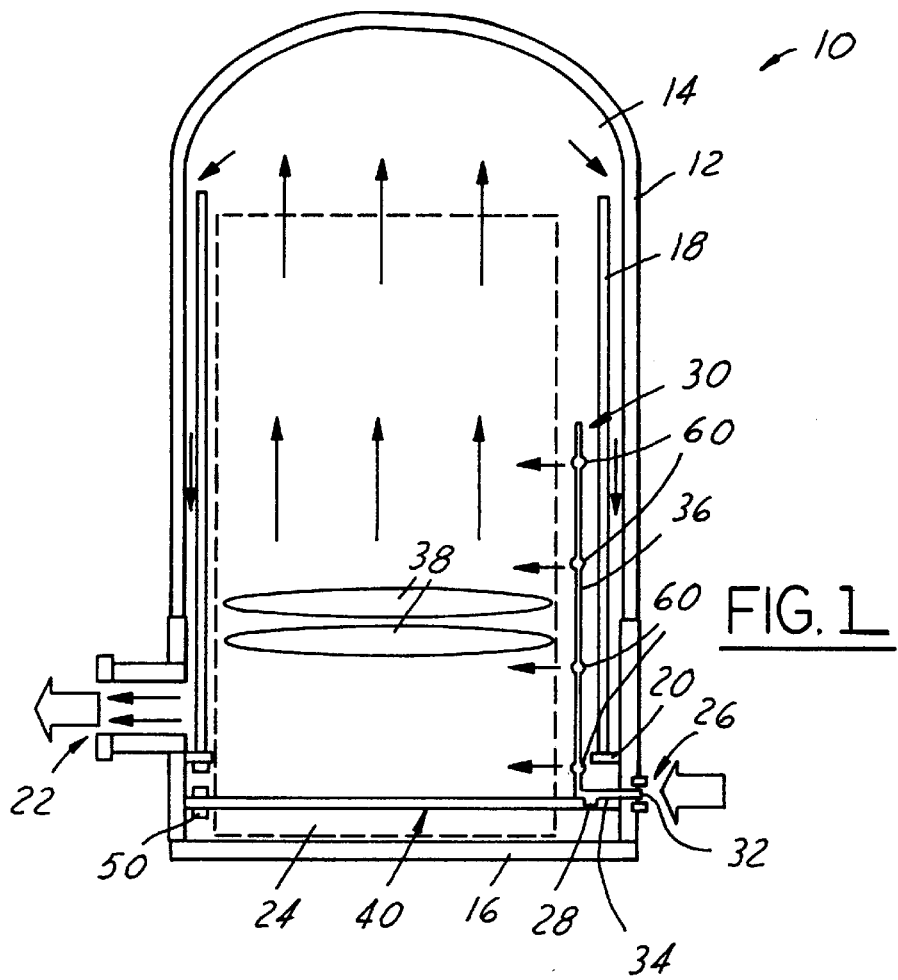
FIG. 1 is a cross-sectional view of the present invention vertical furnace equipped with self-positioning gas injectors positioned on a mounting ring.

Referring now to FIG. 1, wherein a present invention vertical furnace 10 used in semiconductor processing is shown. The furnace 10 is constructed with a cylindrical-shaped heating body or tube 12 provided with a closed upper end and an open bottom end. The body or tube 12 typically includes a plurality of electrical heating elements (not shown) therein coupled with a suitable power source for heating the interior cavity 14 of the body 12 to a temperature of, typically, 250°. The bottom end of the heating body 12 is provided with a flat metal base 16 for sealing the bottom end during processing. Either or both of the body 12 and base 16 may be provided with conduits (not shown) therein coupled with a source of cooling medium for accelerating the cooling down of the furnace, as may be required in certain fabrication processes.

The vertical furnace 10 may further include a fragile, quartz tube 19 having a generally cylindrical-shaped sidewall disposed within the furnace body 12, coaxial with the latter. The inner quartz tube 18 is secured on a base flange 20 mounted juxtaposed to a gas outlet 22 for exhausting reacted gas from the cavity 14. The gas outlet 22 may be coupled with a vacuum pump (not shown) for evacuating the cavity 14 in a rapid manner. The flat metal base 16 may be coupled with a wafer boat elevator (not shown) which supports a wafer boat module 24 (shown in broken lines in FIG. 1) for loading or unloading the wafer boat module into or out of the cavity 14 of the vertical furnace 10. The cylindrical-shaped body 12 may further include a gas inlet 26 located near the flat metal base 16 for mounting of a plurality of gas injectors 30 into the furnace cavity 14 such that inlet end 32 on the horizontal portion 34 of the gas injectors 30 may be exposed to the outside of the furnace tube 12 for connecting to a gas source. The vertical portion 36 of the gas injectors 30 stands in a vertical position, supported by the mounting ring 40 for feeding reactant gases into the cavity 14 during the wafer processing steps. Wafers 38 are further shown in the wafer boat module 24 in FIG. 1.

Detailed views of the mounting ring 40 and the plurality of gas injectors 30 are shown in FIGS. 2A, 2B, 2C, 3A and 3B. The mounting ring 40 may be suitably fabricated of a high temperature, chemical resistant material. One of such suitable materials is stainless steel. The mounting ring 40 may be fabricated with a rectangular cross-section which has a width in the radial direction, a thickness in the vertical direction, and a plurality of slot openings 42,44,46 each opens to an outer periphery 48 of the mounting ring 40, and each has a different depth cut into the width of the ring. For instance, the slot opening 42 has the smallest depth, while the slot opening 46 has the largest depth. It should be noted that the three slot openings 42,44 and 46 shown in the mounting ring 40 are for illustration purposes only, any other suitable numbers of slot openings of various depths may be provided in the surface of a mounting ring. The mounting ring 40 is mechanically fixed to the cylindrical-shaped tube body 12 by hinge means 50, as shown in FIG. 1.

Figure 2A:
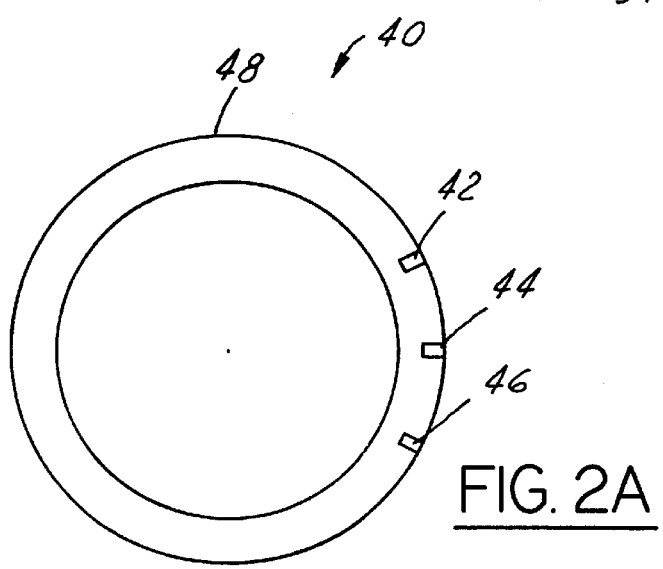
FIG. 2A is a plane view of the mounting ring of FIG. 1.
Figure 2B:
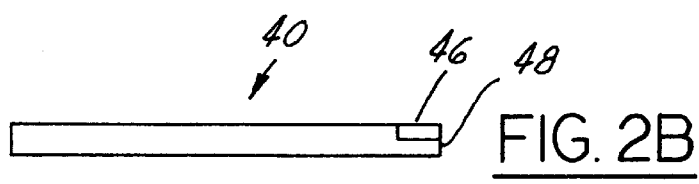
FIG. 2B is a cross-sectional view of the mounting ring of FIG. 1.
Figure 2C:
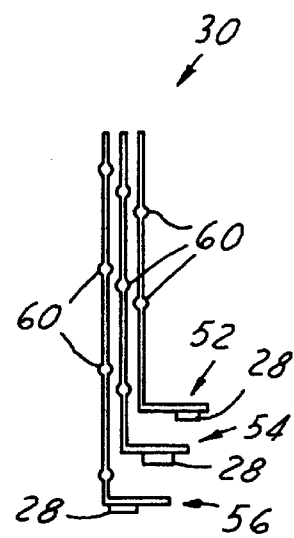
FIG. 2C is a side view of a plurality of gas injectors each having a different length and a differently positioned stopper.

A plurality of gas injectors 30, for instance, gas injector 52,54 and 56 are shown in FIG. 2C. It should be noted that each of the plurality of gas injectors 30 is formed in a "L" configuration with a vertical portion 36 and a horizontal portion 34 that are in fluid communication with each other. Each of the horizontal portions 34 is further provided with an inlet end 32 and a stopper 28 mounted on a bottom surface at a different location for each of the gas injectors 52,54 and 56 when measured from the inlet end 32 of the horizontal portion 34. The different locations of the stopper 28 on each of the plurality of gas injectors 30 is designed such that only one of the plurality of gas injectors 30 would fit into a corresponding one of the slot openings of 42,44 and 46. For instance, by examining FIGS. 2A and 2C, it is seen that gas injector 52 only fits in the slot opening 42 such that the vertical portion 26 of the injector 52 protrudes into the cavity 14 at equal distance when compared to the other two gas injectors 54 and 56.

Similarly, gas injector 54 fits only into slot opening 44, and gas injector 56 fits only into slot opening 46. When all three gas injectors 52,54 and 56 are mounted correctly into the slot openings 42,44 and 46, respectively, the vertical portions 36 of each of the three gas injectors protrude at equal distance into the chamber cavity 14. This is one benefit made possible by the present invention novel apparatus of the mounting ring 40 and the plurality of gas injectors 30 equipped with stoppers 28 in that the plurality of gas injectors is self-positioning and that the same gas injector is always installed into the same slot opening.

Figure 4A:
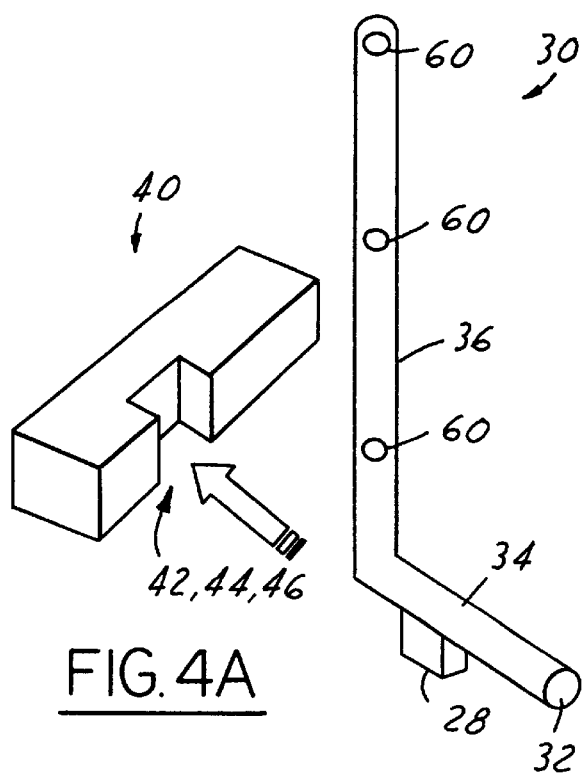
FIG. 4A is a perspective view of a gas injector equipped with a stopper to be mounted to a section of the mounting ring equipped with a slot opening.
Figure 4B:
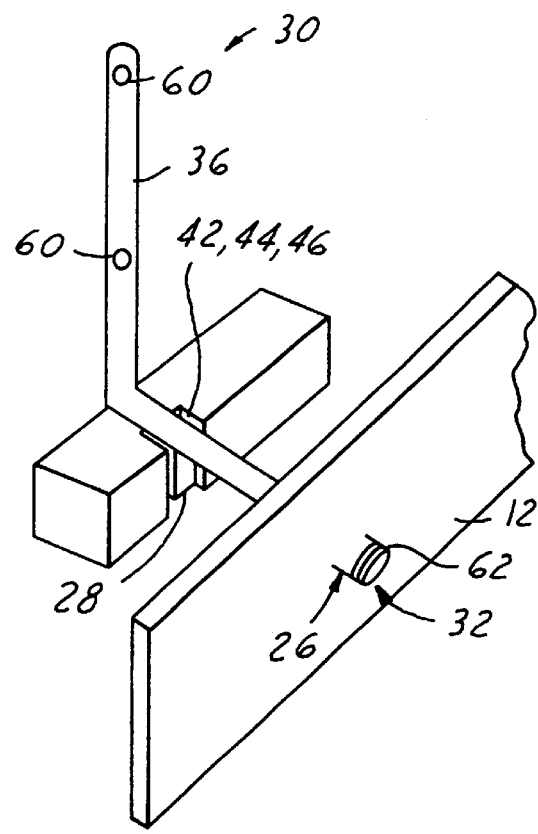
FIG. 4B is the gas injector and the section of the mounting ring of FIG. 4A in an installed position with the inlet end of the injector penetrating through the furnace wall.

An installed relationship between the plurality of gas injectors 30 and the mounting ring 40 is also shown in FIGS. 4A and 4B. A second benefit made possible by the present invention novel apparatus is that self-positioning is made possible by stopper 28 when engaging the slot opening 42,44 or 46 to enable the vertical portion 36 of the gas injector to stand in a perpendicular direction inside the chamber cavity 14. This significantly prevents the vertical portion of the gas injector from tilting either inwardly toward the center of the cavity or outwardly toward the inner tube 18. When the vertical portion 36 of the gas injectors 30 tilts inwardly toward the center of the cavity 14, the rotation of the wafer boat module 24 during processing may cause server damage or even breakage to the gas injector 30. The engagement between the stopper 28 and the slot opening 42,44 or 46 therefore further guarantees the proper positioning of the vertical portion 36 of the gas injectors 30.

It should further be noted that a plurality of apertures 60 are provided in the vertical portion 36 of the gas injectors 30 as gas outlets. The locations of the apertures 60 may be suitably selected based on the requirement of each particular chemical process to be conducted in the vertical furnace 10. For instance, in a $SiO_2$ deposition process, the locations of the apertures 60 may be suitably selected for the different reactant gases of $SiH_4$, $N_2O$ and $N_2$ such that the chemical process occurring on the wafers 38 stored in the wafer boat module 24 can be optimized. It should further be noted that the plurality of gas injectors 30 may each be provided in a different height or in the same height. For instance, the height of the vertical portion 36 of the gas injectors 30 may be between about 50 cm and about 130 cm when used in most chemical vapor deposition furnaces.

The inlet end 32 of the horizontal portion 34 of the gas injector 30 may further be provided with an O-ring 62 which may be color coded for easy identification, i.e. for matching different gas supply conduits to a different inlet end 32 and for achieving a sealing engagement.

The engagement between the stopper 29 and the slot opening 42~46 stabilizes the position of the gas nozzles 30 such that when a vacuum is pulled inside the chamber cavity 14, the gas injectors 30 are not drawn into the cavity by the engagement of the stopper to the slot opening.

Figure 3A:
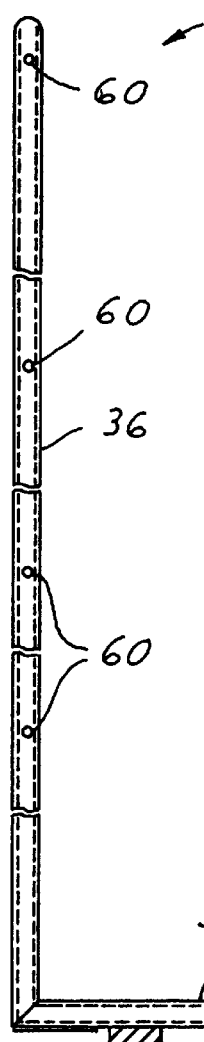
FIG. 3A is a cross-sectional view of a present invention gas injector equipped with a stopper.
Figure 3B:
FIG. 3B is a cross-sectional view of the present invention gas injector illustrating the stopper mounted on the injector.

A detailed cross-sectional view of the gas injectors 30 is shown in FIGS. 3A and 3B, wherein the dimensions of the stopper are shown as 7 mm in height, 10 mm in length and 6.5 mm in thickness. Any other suitable dimensions that are large than 5 mm in height, length and thickness may also be used for the stopper. The stopper may be fabricated in quartz and then fused to the gas injector 30 which is also fabricated in quartz.

The present invention novel vertical furnace equipped with self-positioning gas injectors for processing wafers and a method for mounting the self-positioning gas injectors in a vertical furnace have therefore been amply described in the above description and in the appended drawings of FIGS. 1–4B.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A vertical furnace equipped with self-positioning gas injectors for processing wafers comprising:

a cylindrical-shaped tube having a sealed top and an open bottom, said open bottom being sealable by an end cap;

a cavity formed inside said cylindrical-shaped tube having a size sufficient for a wafer carrier to be positioned therein;

a mounting ring for positioning inside said cavity juxtaposed to said open bottom, said mounting ring having a substantially rectangular cross-section, a width in the radial direction, a thickness in the vertical direction, and a plurality of slot openings each opens to an outer periphery of said ring and each having a different depth cut into said width of said ring; and a plurality of gas injectors each formed in a "L" shape having a vertical portion and a horizontal portion in fluid communication with each other, each of said horizontal portions having an inlet end and are provided with a stopper mounted on a bottom surface at a different location when measured from said inlet end of said horizontal portion such that when said plurality of gas injectors are positioned on top of said mounting ring with each of said nozzle stopper engaging a corresponding one of said plurality of slot openings, the horizontal portions of said plurality of gas injectors extend into said cavity of said cylindrical-shaped tube in said radial direction at a substantially equal distance as measured from an inner surface of said cylindrical-shaped tube.

2. A vertical furnace equipped with self-positioning gas injectors for processing wafers according to claim 1 further comprising an inner tube positioned inside said cylindrical-shaped tube for defining said cavity.

3. A vertical furnace equipped with self-positioning gas injectors for processing wafers according to claim 1, wherein said cylindrical-shaped tube further comprises a plurality of apertures adapted for said inlet ends of said plurality of gas injectors to penetrate therethrough.

4. A vertical furnace equipped with self-positioning gas injectors for processing wafers according to claim 1, wherein said inlet ends of said plurality of gas injectors each provided with an O-ring for sealingly engaging a gas supply conduit.

5. A vertical furnace equipped with self-positioning gas injectors for processing wafers according to claim 1, wherein said cavity being sufficiently large for a wafer boat that carries at least 172 wafers to be positioned therein.

6. A vertical furnace equipped with self-positioning gas injectors for processing wafers according to claim 1, wherein said cylindrical-shaped tube being fabricated of a substantially transparent, high temperature resistant ceramic material.

7. A vertical furnace equipped with self-positioning gas injectors for processing wafers according to claim 1, wherein said cylindrical-shaped tube and said plurality of gas injectors are fabricated of quartz.

8. A vertical furnace equipped with self-positioning gas injectors for processing wafers according to claim 1, wherein said mounting ring being fabricated of a high temperature and corrosion-resistant material.

9. A vertical furnace equipped with self-positioning gas injectors for processing wafers according to claim 1, wherein said vertical portions of said plurality of gas injectors further comprises at least one aperture for gas outlet.

10. A vertical furnace equipped with self-positioning gas injectors for processing wafers according to claim 1, wherein said vertical portions of said plurality of gas injectors each having a length between about 50 cm and about 150 cm.

11. A vertical furnace equipped with self-positioning gas injectors for processing wafers according to claim 1, wherein said stoppers mounted on said plurality of gas injectors each being formed to a length of at least 5 mm, a height of at least 5 mm and a thickness of at least 5 mm.

12. A vertical furnace equipped with self-positioning gas injectors for processing wafers according to claim 1, wherein said stoppers are formed of quartz and are fused to said horizontal portions of said plurality of gas injectors.

13. A vertical furnace equipped with self-positioning gas injectors for processing wafers according to claim 1, wherein said horizontal portions of said plurality of gas injectors having the same length of at least 40 mm.

14. A method for mounting a plurality of gas injectors in a vertical furnace for processing wafers comprising the steps of:

providing a furnace body of a cylindrical-shaped tube having a sealed top and an open bottom, said open bottom being sealable by an end cap, said furnace body having a cavity formed therein of a size sufficient for a wafer carrier to be positioned therein, said furnace body further having a mounting ring positioned inside said cavity juxtaposed to said open bottom, said mounting ring having a substantially rectangular cross-section, a width in the radial direction, a thickness in the vertical direction, and a plurality of slot openings each opens to an outer periphery of said ring and each having a different depth cut into said width of said ring;

providing a plurality of gas injectors in tubular shape each formed in a "L" configuration having a vertical portion and a horizontal portion in fluid communication with each other, each of said horizontal portions having an inlet end and are provided with a stopper mounted on a bottom surface at a location different than the other gas injectors when measured from said inlet end of said horizontal portion; and positioning said plurality of gas injectors on top of said mounting ring by engaging each of said stoppers on said gas injectors to a corresponding one of said plurality of slot openings on said mounting ring such that the horizontal portions of said plurality of gas injectors extend into said cavity of said cylindrical-shaped tube in said radial direction at a substantially equal distance as measured from an inner surface of said cylindrical-shaped tube.

15. A method for mounting a plurality of gas injectors in a vertical furnace for processing wafers according to claim 14 further comprising the step of penetrating said inlet ends of said plurality of gas injectors through a plurality of apertures in said furnace body for connecting to a plurality of gas supplies.

16. A method for mounting a plurality of gas injectors in a vertical furnace for processing wafers according to claim 14 further comprising the step of mounting onto each of said inlet ends of said plurality of gas injectors an O-ring for sealingly engaging a gas supply conduit.

17. A method for mounting a plurality of gas injectors in a vertical furnace for processing wafers according to claim 14 further comprising the step of preventing said vertical portions of said plurality of gas injectors from tilting away from a vertical position by engaging said stoppers on said gas injector to said slot openings in said mounting ring.

18. A method for mounting a plurality of gas injectors in a vertical furnace for processing wafers according to claim 14 further comprising the step of fabricating said cylindrical-shaped tube and said plurality of gas injectors in quartz.

19. A method for mounting a plurality of gas injectors in a vertical furnace for processing wafers according to claim 14 further comprising the step of fabricating said mounting ring in a high temperature and corrosion-resistant material.

20. A method for mounting a plurality of gas injectors in a vertical furnace for processing wafers according to claim 14 further comprising the step of fabricating said vertical portions of said plurality of gas injectors with at least one aperture for gas outlet.

* * * * *